(12) United States Patent
Myers et al.

(10) Patent No.: US 10,504,573 B2
(45) Date of Patent: Dec. 10, 2019

(54) ARRAY OF PROGRAMMABLE MEMORY ELEMENTS WITH AN ARRAY OF SECOND CIRCUIT ELEMENTS

(71) Applicant: ARM LIMITED, Cambridge (GB)

(72) Inventors: James Edward Myers, Bottisham (GB); David William Howard, Cambridge (GB); John Philip Biggs, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/762,752

(22) PCT Filed: Oct. 14, 2016

(86) PCT No.: PCT/GB2016/053190
§ 371 (c)(1),
(2) Date: Mar. 23, 2018

(87) PCT Pub. No.: WO2017/068328
PCT Pub. Date: Apr. 27, 2017

(65) Prior Publication Data
US 2018/0268885 A1    Sep. 20, 2018

(30) Foreign Application Priority Data
Oct. 20, 2015    (GB) .................................. 1518574.7

(51) Int. Cl.
*G11C 11/00* (2006.01)
*G11C 14/00* (2006.01)
(Continued)

(52) U.S. Cl.
CPC ........ *G11C 11/005* (2013.01); *G11C 14/0054* (2013.01); *G11C 17/14* (2013.01);
(Continued)

(58) Field of Classification Search
CPC ... G11C 11/005; G11C 17/14; G11C 14/0054; G11C 17/12; G11C 11/40; G11C 17/18; H01L 27/105
See application file for complete search history.

(56) References Cited

U.S. PATENT DOCUMENTS 8,885,392 B1    11/2014 Choe
2001/0039124 A1    11/2001 Shimoda
(Continued)

FOREIGN PATENT DOCUMENTS

EP    1801879    6/2007
WO    WO 2015/121298    8/2015

OTHER PUBLICATIONS

International Search Report and Written Opinion of the ISA for PCT/GB2016/053190, dated Jan. 26, 2017, 10 pages.
(Continued)

*Primary Examiner* — Jerome Leboeuf
(74) *Attorney, Agent, or Firm* — Nixon & Vanderhye P.C.

(57) ABSTRACT

A circuit comprises an array of programmable memory elements fabricated on a substrate, each memory element having one or more processable regions which, when processed by an external process in which a material is applied to at least partially cover one or more of the regions, are configured to program that memory element to one of multiple states; a first set of control lines connected to the array of memory elements, by which the contents of each individual memory element are capable of being accessed by control signals applied to a respective combination of at least two control lines in the first set of control lines; and an array of second circuit elements, different to the memory elements, each connected to a control line of the first set of control lines and to another control line of a second set of
(Continued)

control lines, different to the first set of control lines, so as to provide access to second circuit elements in the array.

17 Claims, 7 Drawing Sheets

(51) Int. Cl.
G11C 17/14 (2006.01)
H01L 27/12 (2006.01)
G11C 17/18 (2006.01)
G11C 11/40 (2006.01)
G11C 17/12 (2006.01)

(52) U.S. Cl.
CPC .............. *G11C 11/40* (2013.01); *G11C 17/12* (2013.01); *G11C 17/18* (2013.01); *H01L 27/12* (2013.01)

(56) References Cited

U.S. PATENT DOCUMENTS

| 2005/0133790 | A1* | 6/2005 | Kato | H01L 21/76892 |
| | | | | 257/66 |
| 2006/0145951 | A1 | 7/2006 | Watanabe et al. | |
| 2007/0042515 | A1 | 2/2007 | Edelen | |
| 2007/0211511 | A1* | 9/2007 | Kane | G11C 11/5692 |
| | | | | 365/100 |
| 2008/0170430 | A1* | 7/2008 | Miller | G11C 11/005 |
| | | | | 365/156 |
| 2008/0205132 | A1 | 8/2008 | Hirakata | |
| 2009/0121218 | A1 | 5/2009 | Ullmann et al. | |
| 2009/0323434 | A1* | 12/2009 | Komatsu | G11C 11/005 |
| | | | | 365/189.2 |
| 2013/0146334 | A1 | 6/2013 | Wang et al. | |
| 2014/0056050 | A1 | 2/2014 | Yang et al. | |
| 2015/0092479 | A1* | 4/2015 | Dong | G11C 7/1075 |
| | | | | 365/158 |

OTHER PUBLICATIONS

Combined Search and Examination Report for GB1518574.7, dated Dec. 16, 2015, 8 pages.

Myny K et al, "8b Thin-film microprocessor using a hybrid oxide-organic complementary technology with inkjet-printed P2ROM memory", 2014 IEEE International Solid State Circuits Conference, ISSCC 2014, Session 30, Technologies for Next-Generation Systems, 30. 1, Feb. 12, 2014, pp. 486-487.

Myny K et al, "A thin-film microprocessor with inkjet print-programmable memory", Scientific Reports, 4; 7398, published Dec. 10, 2014, 6 pages.

Examination Report for GB Application No. 1518574.7 dated Aug. 20, 2019, 4 pages.

* cited by examiner

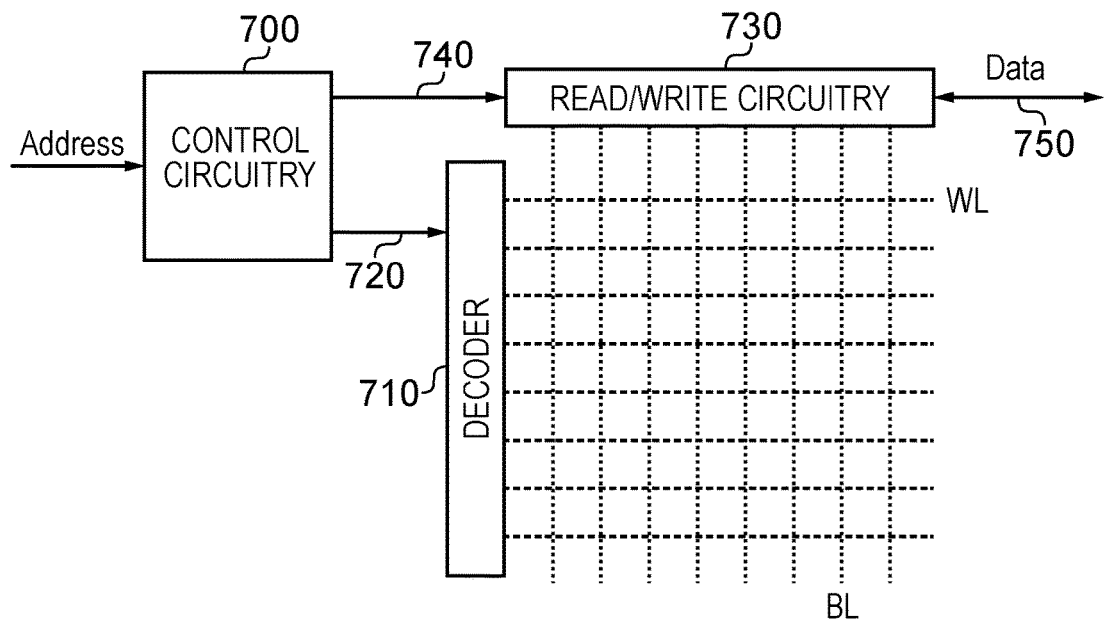
FIG. 7
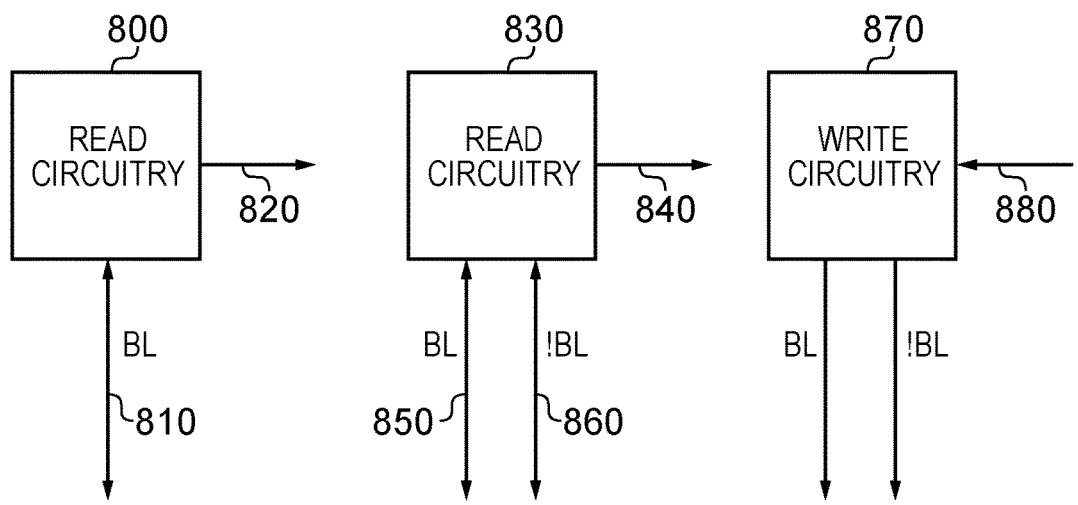
FIG. 8
FIG. 9
FIG. 10

_US 10,504,573 B2_

ARRAY OF PROGRAMMABLE MEMORY ELEMENTS WITH AN ARRAY OF SECOND CIRCUIT ELEMENTS

This application is the U.S. national phase of International Application No. PCT/GB2016/053190 filed 14 Oct. 2016, which designated the U.S. and claims priority to GB Patent Application No. 1518574.7 filed 20 Oct. 2015, the entire contents of each of which are hereby incorporated by reference.

BACKGROUND

This disclosure relates to memory circuits.

Technologies have been proposed to provide low cost, low power electronic devices for widespread use, for example in order to add an electronic processing capability to items which previously had no such capability. An example relates to the so-called Internet of Things (IoT) in which devices which previously had no processing or networking capability are given such a capability. Another example relates to applications such as "smart" labelling of products in which a stick-on electronic circuit provides the function of an intelligent product label, for example being sensitive to the storage conditions or current price of the product.

The field of "printed electronics" is being developed to enable the low cost production of this type of device. In some examples, entire circuits including various circuit elements are printed onto a substrate (such as a flexible plastic or paper substrate) using, for example, an ink-jet printer mechanism. In other examples, a circuit is fabricated using a slightly more conventional fabrication process but is made "print-programmable" by providing externally accessible regions onto which a user can apply (for example, print) conductive material in order to connect a pair of conductors at the region and change the state of the circuitry. An application of this technique is in a circuit comprising an array of programmable memory elements fabricated on a substrate, each memory element having one or more processable regions which, when processed by an external process in which a material (such as a conductive material or ink) is applied to at least partially cover one or more of the regions, are configured to program that memory element to one of multiple states.

SUMMARY

In an example arrangement there is provided a circuit comprising:

an array of programmable memory elements fabricated on a substrate, each memory element having one or more processable regions which, when processed by an external process in which a material is applied to at least partially cover one or more of the regions, are configured to program that memory element to one of multiple states;

a first set of control lines connected to the array of memory elements, by which the contents of each individual memory element are capable of being accessed by control signals applied to a respective combination of at least two control lines in the first set of control lines; and an array of second circuit elements, different to the memory elements, each connected to a control line of the first set of control lines and to another control line of a second set of control lines, different to the first set of control lines, so as to provide access to second circuit elements in the array.

In another example arrangement there is provided a circuit comprising:

an array of programmable memory means fabricated on a substrate, each memory means having one or more processable regions which, when processed by an external process in which a material is applied to at least partially cover one or more of the regions, are configured to program that memory means to one of multiple states;

a first set of control lines connected to the array of memory means, by which the contents of each individual memory means are capable of being accessed by control signals applied to a respective combination of at least two control lines in the first set of control lines; and an array of second circuit means, different to the memory means, each connected to a control line of the first set of control lines and to another control line of a second set of control lines, different to the first set of control lines, so as to provide access to second circuit means in the array.

In another example arrangement there is provided a method of fabricating a circuit comprising:

fabricating an array of programmable memory elements on a substrate, each memory element having one or more processable regions which, when processed by an external process in which a material is applied to at least partially cover one or more of the regions, are configured to program that memory element to one of multiple states;

fabricating a first set of control lines connected to the array of memory elements, by which the contents of each individual memory element are capable of being accessed by control signals applied to a respective combination of at least two control lines in the first set of control lines; and fabricating an array of second circuit elements, different to the memory elements, each connected to a control line of the first set of control lines and to another control line of a second set of control lines, different to the first set of control lines, so as to provide access to second circuit elements in the array.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which:

FIG. 7 schematically illustrates memory access circuitry;

FIGS. 8 and 9 schematically illustrate examples of read circuitry;

FIG. 10 schematically illustrates an example of write circuitry;

DESCRIPTION OF EMBODIMENTS

Figure 1:
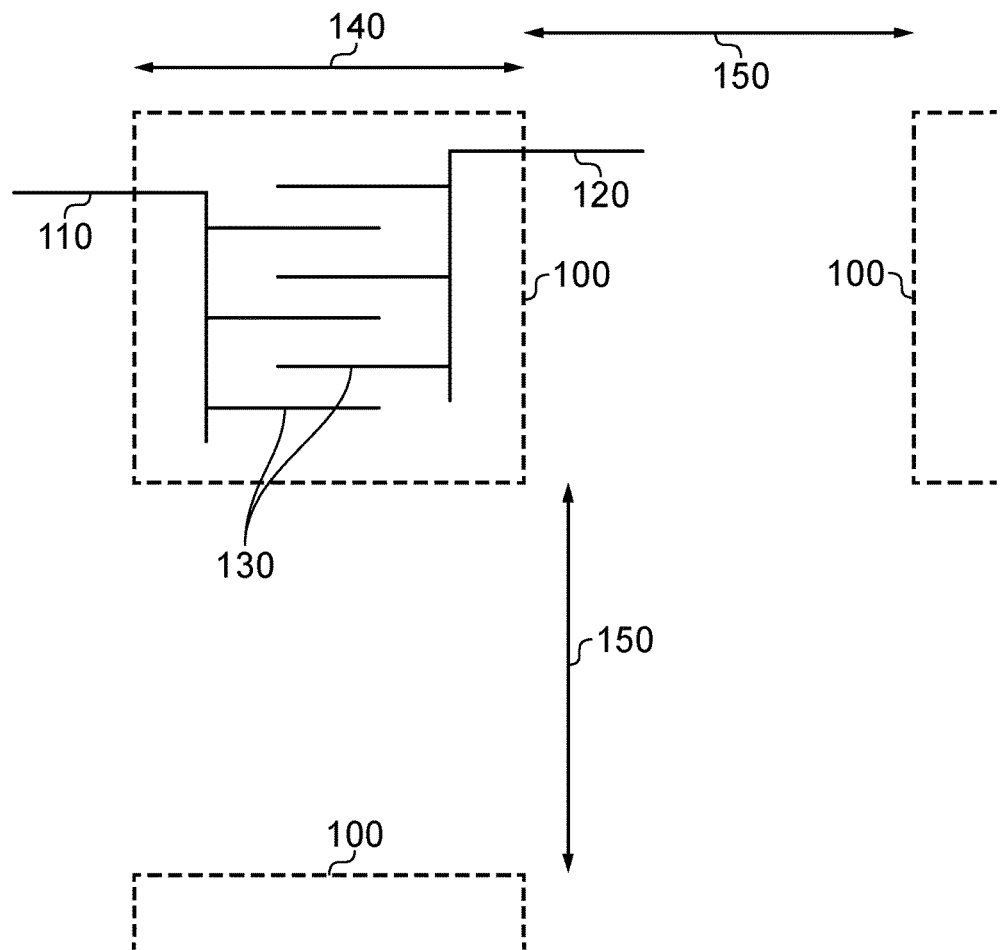
FIG. 1 schematically illustrates an array of print-programmable regions.

Before discussing the embodiments with reference to the accompanying figures, the following description of embodiments is provided.

An example embodiment provides a circuit comprising:

an array of programmable memory elements fabricated on a substrate, each memory element having one or more processable regions which, when processed by an external process in which a material is applied to at least partially cover one or more of the regions, are configured to program that memory element to one of multiple states;

a first set of control lines connected to the array of memory elements, by which the contents of each individual memory element are capable of being accessed by control signals applied to a respective combination of at least two control lines in the first set of control lines; and an array of second circuit elements, different to the memory elements, each connected to a control line of the first set of control lines and to another control line of a second set of control lines, different to the first set of control lines, so as to provide access to second circuit elements in the array.

Embodiments of the disclosure recognise that in a print-programmable or similar arrangement in which regions are provided for setting the state of elements of a memory (for example a ROM) circuit, parameters relating to the externally applied process can mean that the regions need to be relatively large, and/or that the regions need to be spaced apart. Either or both of these aspects can lead to otherwise wasted space, which is a problem that embodiments of the disclosure recognise and address by providing second circuit elements which can share either the bit lines or the word lines of the memory elements.

In example embodiments the control lines may be word lines and/or bit lines. For example the first set of control lines comprises a first array of bit lines and a first array of word lines connected to the array of memory elements, by which a word line of the first array of word lines enables access to a group of the memory elements, the contents of individual memory elements in an enabled group being capable of being accessed by the bit lines of the first array of bit lines; and the array of second circuit elements are connected to one but not the other of the first array of word lines and the first array of bit lines so as to provide access to second circuit elements in the array. In some examples the second set of control lines comprises a second array of word lines, by which a word line of the second array of word lines enables access to a group of the second circuit elements, individual second circuit elements in an enabled group being capable of being accessed by the bit lines of the first array of bit lines.

In order to make use of the otherwise available space, in example embodiments the second circuit elements are interleaved with the memory elements on the substrate. For example, the second circuit elements could be disposed between memory elements on the substrate, and/or the second circuit elements on the substrate could be at least partially overlapped by memory elements.

Various external processes are possible, an example being to cover a light-sensitive region with an opaque material. However, the example embodiments are particularly suited to an arrangement in which the regions comprise a pair of conductors which can be connected to one another by application of or covering by a conductive material onto the pair of conductors.

Because the conductors may be exposed at least during the external processing, example embodiments can provide one or more components connected to each of the pair of conductors to provide an electrostatic discharge path.

Various options are available for access to the memory elements and the second circuit components. For example, the memory elements may be each connected to a single respective bit line, the circuit comprising memory reading circuitry being configured to detect the state of a memory element using the single respective bit line. In examples, the second circuit elements are each connected to a pair of bit lines, the circuit comprising second circuit element access circuitry being configured to access the state of a second circuit element according to a differential signal on the respective pair of bit lines.

In example embodiments, each second circuit element is interleaved with multiple adjacent memory elements on the substrate.

In order to be able to access data words of a consistent word length, example embodiments comprise control circuitry configured to access the memory elements in groups of n memory elements, where n is an integer greater than 1, and configured to access the second circuit elements in groups of n second circuit elements. In an example arrangement two arrays of memory elements are provided in which in each array a group of n memory elements is accessed by a word line, the control circuitry being configured to access second circuit elements in each of the two arrays in order to access a group of n second circuit elements.

In examples, the second circuit elements are random access memory (RAM) elements. Other examples of second circuit elements include read only memory elements different to the first-mentioned memory elements, light emitting elements or light sensing elements.

Another example embodiment provides a circuit comprising:

an array of programmable memory means fabricated on a substrate, each memory means having one or more processable regions which, when processed by an external process in which a material is applied to at least partially cover one or more of the regions, are configured to program that memory means to one of multiple states;

a first set of control lines connected to the array of memory means, by which the contents of each individual memory means are capable of being accessed by control signals applied to a respective combination of at least two control lines in the first set of control lines; and an array of second circuit means, different to the memory means, each connected to a control line of the first set of control lines and to another control line of a second set of control lines, different to the first set of control lines, so as to provide access to second circuit means in the array.

The circuits discussed above as example embodiments may be implemented as data processing apparatus comprising a substrate on which is fabricated a circuit as defined above, and processing circuitry configured to operate in accordance with information stored by the array of memory elements.

Another example embodiment provides a method of fabricating a circuit comprising:

fabricating an array of programmable memory elements on a substrate, each memory element having one or more processable regions which, when processed by an external process in which a material is applied to at least partially cover one or more of the regions, are configured to program that memory element to one of multiple states;

fabricating a first set of control lines connected to the array of memory elements, by which the contents of each individual memory element are capable of being accessed by control signals applied to a respective combination of at least two control lines in the first set of control lines; and fabricating an array of second circuit elements, different to the memory elements, each connected to a control line of the first set of control lines and to another control line of a second set of control lines, different to the first set of control lines, so as to provide access to second circuit elements in the array.

The method may include processing one or more of the regions by the external non-electrical process by applying a conductive material over one or more of the regions using an ink-jet printing process.

Referring now to the drawings, FIG. 1 schematically illustrates an array of print-programmable regions.

A print-programmable device such as a print-programmable memory makes use of one or more processable regions which, when processed by an external process in which a material is applied to at least partially cover one or more of the regions, can change the state of the underlying circuit or device. An example of such an arrangement is a read-only memory having an array of memory elements fabricated on a substrate, each memory element having one or more such regions which, when processed in this manner, are configured to program that memory element to one of multiple states.

This type of arrangement can be useful in the production of low-cost and generally low-processing power electronic devices, though it is useful in other applications. For example, an electronic device can be fabricated having a memory such as a ROM containing, for example, program instructions and/or operational parameters, which can be programmed by an ink jet or similar printing process after device fabrication, in which selected ones of the processable regions are printed and at least partially covered with a conductive ink. This type of arrangement allows such devices to be initially fabricated onto a substrate but then for a final fabrication step (the programming of the ROM) to be carried out using relatively cheap and easy to set up printing apparatus.

Referring to FIG. 1, example processable regions 100 are shown, each of which contains a pair of conductors 110, 120 which are unconnected unless a conductive ink or similar material is deposited over the conductors so as to form a connection between them. In other words, the pair of conductors can be connected to one another by the application of a conductive material over the pair of conductors. For example, the conductors may be inter-digitated having overlapping but non-touching fingers 130 to allow for shorting between the pair of conductors when the conductive material is applied, but without necessarily requiring particularly specific alignment of the conductive material. So, the fingers 130 can provide greater tolerance in the spatial position at which the conductive material is applied.

Each region 100 has a certain minimum size 140, for example a length and width of 50 μm, to allow for parameters of the printing process such as a minimum achievable ink spot size and a minimum positional resolution at which a spot can be printed. Similarly, a spacing 150 between adjacent regions 100 has a minimum size of, say, 50 μm, again to allow for the positional registration of spots printed by a typical inkjet device.

Figure 2:
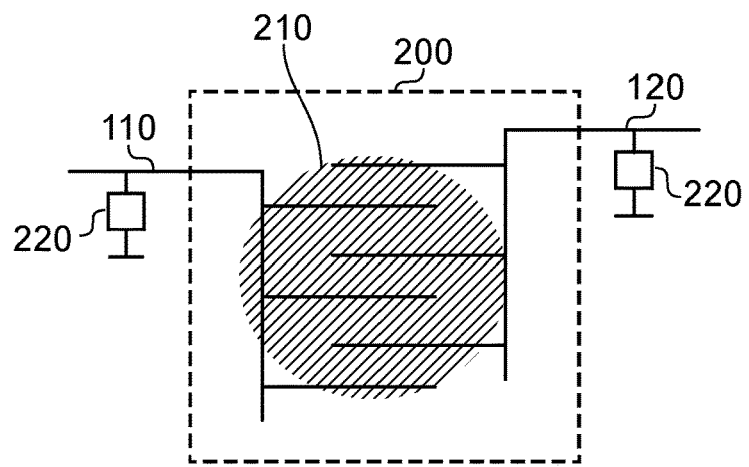
FIG. 2 schematically illustrates a print-programmable region at least partially covered by a conductive material.

FIG. 2 schematically illustrates a print-programmable region 200 which is at least partially covered by a conductive material 210. As discussed above, the conductive material 210 may be applied by an inkjet process so as to cover (at least partially) one or more of the print-programmable regions.

FIG. 2 also shows example components 220 connected between the conductors 110, 120 and a voltage rail such as a ground rail in order to provide an electrostatic discharge path. An example of a component 220 is a so-called electrostatic discharge (ESD) diode arranged so that in normal operation, the diode is not conducting to ground, but in the event that a voltage higher than a threshold is placed on one or more of the conductors 110, 120, the component 220 is conductive to ground. A reason for including the components 220 is that during at least a print-programming stage of the use of the device having the regions 200, the regions 200 are exposed to the exterior of the device and so are, at least in principle, vulnerable to a user touching one or more regions with a finger or other implement. In the absence of ESD protection such a touch could lead to a potentially damaging electrical discharge being applied to one of the conductors. Note that in example embodiments, after the print-programming stage has been carried out, the device may be encapsulated or coated with an insulating coating or cover to avoid damage to the print-programmed regions and also to avoid or lessen ESD issues.

Figure 3:
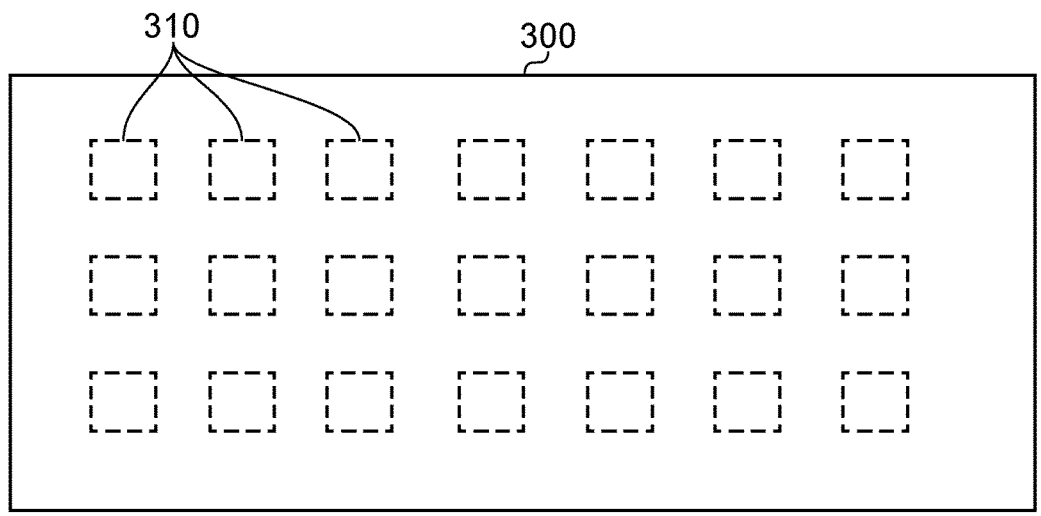
FIG. 3 schematically illustrates a substrate.

FIG. 3 schematically illustrates a substrate 300 carrying multiple ones of the print-programmable regions 310. As discussed above, these are spaced apart in order to allow for the positional registration of the printing process and avoid conductive material intended for one region being accidentally applied to an adjacent region. It can be seen from FIG. 3 that this spacing leads to a relatively large proportion of the substrate area being not covered by such regions. In the examples provided so far, in which the size of a region is substantially the same as the inter-region spacing, the regions occupy about one quarter of the substrate area. Techniques for making use of this inter-region space will be discussed below.

Figure 4:
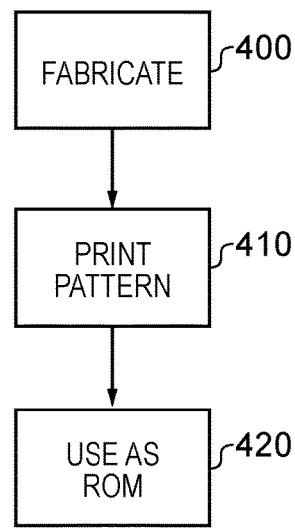
FIG. 4 is a schematic flow chart illustrating a method of manufacturing and using a circuit.

FIG. 4 is a schematic flow chart illustrating a method of manufacturing and using a circuit of the type described here.

At a step 400, a print-programmable circuit is fabricated. An example of a fabrication technique will be discussed in more details below with reference to FIG. 15.

At a step 410, a pattern of one or more areas of conductive material such as conductive ink is disposed or printed onto corresponding regions of the fabricated device. As mentioned above, the printing step may be followed by an optional covering step in which an insulated cover or layer is applied.

Then, at a step 420, the circuit is used in its programmed state, for example with the print-programmable regions to which the pattern has been applied at the step 410 forming a ROM.

Other options are available, instead of the use of conductive ink. For example, the regions could contain light-sensitive components such that a change of state can be achieved by printing an opaque material over the region.

Figure 5:
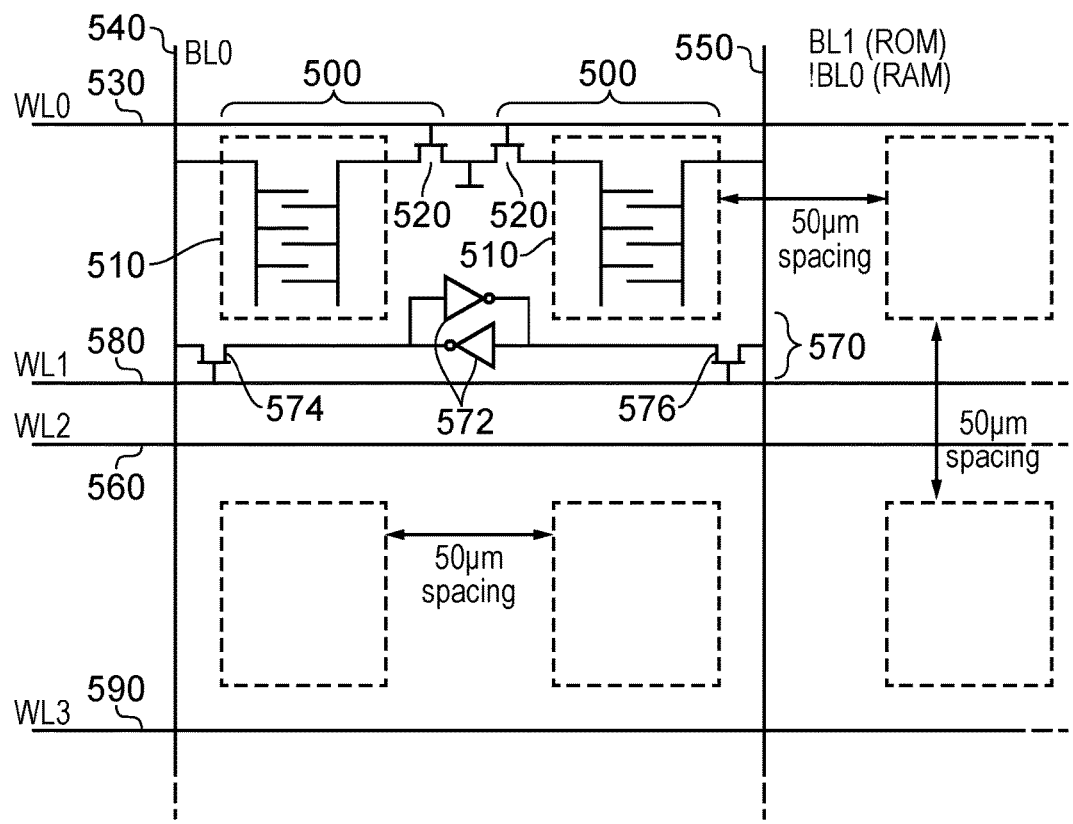
FIG. 5 schematically illustrates a read only memory (ROM) device.

FIG. 5 schematically illustrates a read-only memory (ROM) device as an example of a memory device. The device of FIG. 5 is formed as a circuit comprising an array of programmable memory or ROM elements 500. These are fabricated on a substrate and each comprise one or more processable regions 510 which, when processed by an external process (such as the print-programming process discussed above) in which a material is applied to at least partially cover one or more of the regions, are configured to program that ROM element to one of multiple states. To achieve this, each ROM element also comprises one or more read transistors 520. The state of the ROM element 500 is therefore defined by whether or not the conductors of the region 510 for that element are shorted together by conductive ink or are open-circuit.

The reading process for the ROM elements will be discussed further below, but, briefly, a selection of a row of ROM elements is made by asserting a word line 530, and the state of ROM elements on that row can be detected at respective bit lines 540, 550, with one bit line giving the state of a corresponding single ROM element.

Amongst the array of ROM elements there is provided a first array of bit lines 540, 550 . . . and a first array of word lines 530, 560 . . . connected to the array of ROM elements by which a word line of the first array of word lines enables access to a group of the ROM elements (for example, a horizontal row as drawn), the contents of individual ROM elements in an enabled group being capable of being accessed by the bit lines of the first array of bit lines. These provide an example of a first set of control lines connected to the array of memory elements, by which the contents of each individual memory element are capable of being accessed by control signals applied to a respective combination of at least two control lines (such as a pair of bit lines associated with that memory element or a group or column (as drawn) of memory elements including that memory element) in the first set of control lines. For example, the control lines may be word lines and/or bit lines.

As discussed above, the minimum spacing requirements of the regions mean that a considerable amount of substrate area exists between the print-programmable regions. Each ROM element 500 comprises a region 510 and a respective transistor 520, and the transistor 520 may be fabricated so as to be smaller, in terms of substrate area, than the region 510. In order to utilise the space between the regions, example embodiments provide a circuit comprising an array of second circuit elements, different from the ROM elements, interleaved with the ROM elements on the substrate. For example, the array of second circuit elements may be connected to one but not the other of the first array of word lines and the first array of bit lines so as to provide access to second circuit elements in the array. The array of second circuit elements, different to the memory elements, may be each connected to a control line (or indeed more than one control line such as a balanced pair of bit lines) of the first set of control lines and to another control line of a second set of control lines (such as word lines), different to the first set of control lines, so as to provide access to second circuit elements in the array.

An example shown in FIG. 5 is to provide a random access memory (RAM) element 570 in the space between the regions 510 which is not occupied by the transistors 520. Various different forms of RAM element may be used, but in the example shown in FIG. 5 a RAM element using a pair of inverters 572 and transistors 574, 576 is employed. The RAM elements 570 are selected as rows (as drawn) by their own respective word lines 580, 590, different to the word lines 530, 560 used to select ROM elements. However, they share the bit lines 540, 550 with the ROM elements. So, the system is capable of accessing either the ROM elements or the RAM elements in a single access cycle, according to which of the word lines is enabled. The same bit lines are shared for access to the ROM elements and the RAM elements. Again, in this example, the RAM element as drawn uses two bit lines (compared to the ROM elements which each use one bit line for access) such that a differential reading and writing process is used in which for the example element 570 drawn on FIG. 5, both of the bit lines 540, 550 are involved.

In this way, FIG. 5 provides an example in which the array of second circuit elements (the RAM elements) is connected to a second array of word lines (580, 590) by which a word line of the second array of word lines enables access to a group of the second circuit elements. However, individual second circuit elements in an enabled group are accessed by the bit lines 540, 550 of the first array of bit lines. In other words, the bit lines are shared with the ROM elements.

Similarly, FIG. 5 provides an example in which the first set of control lines comprises a first array of bit lines and a first array of word lines connected to the array of memory elements, by which a word line of the first array of word lines enables access to a group of the memory elements, the contents of individual memory elements in an enabled group being capable of being accessed by the bit lines of the first array of bit lines; and the array of second circuit elements are connected to one but not the other of the first array of word lines and the first array of bit lines so as to provide access to second circuit elements in the array. In such an example, the second set of control lines comprises a second array of word lines, by which a word line of the second array of word lines enables access to a group of the second circuit elements, individual second circuit elements in an enabled group being capable of being accessed by the bit lines of the first array of bit lines.

Figure 6:
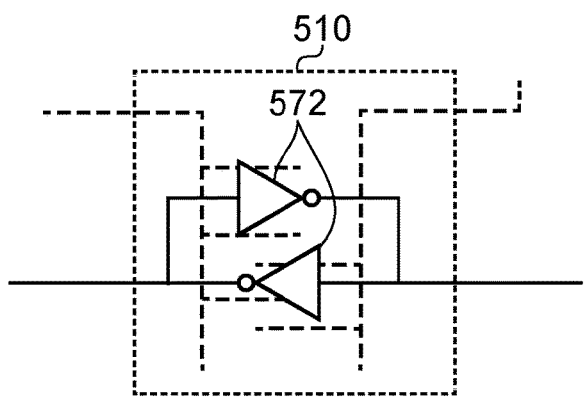
FIG. 6 schematically illustrates an aspect of component layout.

In general terms, the second circuit elements are interleaved with the ROM elements 500 on the substrate. This can mean (as shown in FIG. 5) that the second circuit elements are disposed in spaces between the ROM elements 500. In an alternative, shown schematically in FIG. 6, the second circuit elements on the substrate are at least partially overlapped by ROM elements. Here, the inverters 572 are shown fabricated underneath one of the regions 510 of a ROM element. The term "underneath" does not refer to any requirement for orientation in manufacture or eventual use, but simply refers to the aspect that the region 510 should externally accessible at least during the print-programming part of the process.

FIG. 7 schematically illustrates memory access circuitry for use with a circuit such as that shown in FIG. 5.

In an arrangement in which bit lines are shared between the ROM elements and the second circuit elements (in this example, RAM elements) but separate word lines are used, control circuitry 700 is employed to control accesses to memory elements on the device. Accesses to ROM elements and RAM elements may be differentiated by their memory addresses, for example so that one region of memory address space is allocated to the ROM elements and another, separate, region of memory address space is allocated to the RAM elements. The control circuitry 700 receives a memory address and detects whether access is to a ROM element (or a group of ROM elements, for example forming a word) or to a RAM element or a group of RAM elements. Depending on this detection, a word line decoder 710 is controlled by a control signal 720 to activate either a word line corresponding to the ROM elements or a word line corresponding to the RAM elements.

Also, in the example of FIG. 5, access to the ROM elements is handled using the bit lines in a different manner to access to the RAM elements. For example, the ROM elements in FIG. 5 are each connected to a single respective bit line, and read/write circuitry 730 comprises ROM reading circuitry configured to detect the state of a ROM element using the single respective bit line. Similarly, the RAM elements (as examples of second circuit elements) in FIG. 5 are each connected to a pair of bit lines, and the read/write circuitry 730 comprises second circuitry element access circuitry configured to access the state of a second circuit element (RAM element) for example) according to a differential signal on the respective pair of bit lines.

Note that access to a ROM element is a read access only, whereas access to a RAM element could be a read access or a write access.

Accordingly, the control circuitry 700 controls the read/write circuitry 730, by a control signal 740, to carry out either a read operation using a single respective bit line for each ROM element, or a read or write operation using a pair of bit lines for each RAM element. The data accessed by the read/write circuitry is output (in the case of ROM accesses and RAM read accesses) or input (in the case of RAM write accesses) via a data interface 750.

FIGS. 8 and 9 schematically illustrate examples of read circuitry, with FIG. 8 representing read circuitry 800 configured to detect the state of an element using a single respective bit line 810 and to output data 820 depending on the state of that bit line. For example, the read circuitry 800 can precharge or set the bit line 810 to a particular state and detect any change in the state of the bit line afterwards.

FIG. 9 schematically illustrates differential or double-ended read circuitry 830 which generates output data 840 in dependence upon a differential reading operation with respect to two bit lines, shown in FIG. 9 as a bit line BL 850 and a complimentary differential bit line !BL 860, where the ! indicates a complimentary state. For example, the read circuitry 830 of FIG. 9 can precharge both of the bit lines 850, 860 to a particular state and detect which of them changes state thereafter.

FIG. 10 schematically illustrates an example of write circuitry 870 which writes data 880 to a RAM element by asserting a write data value and its complement to BL and !BL respectively.

Figure 11:
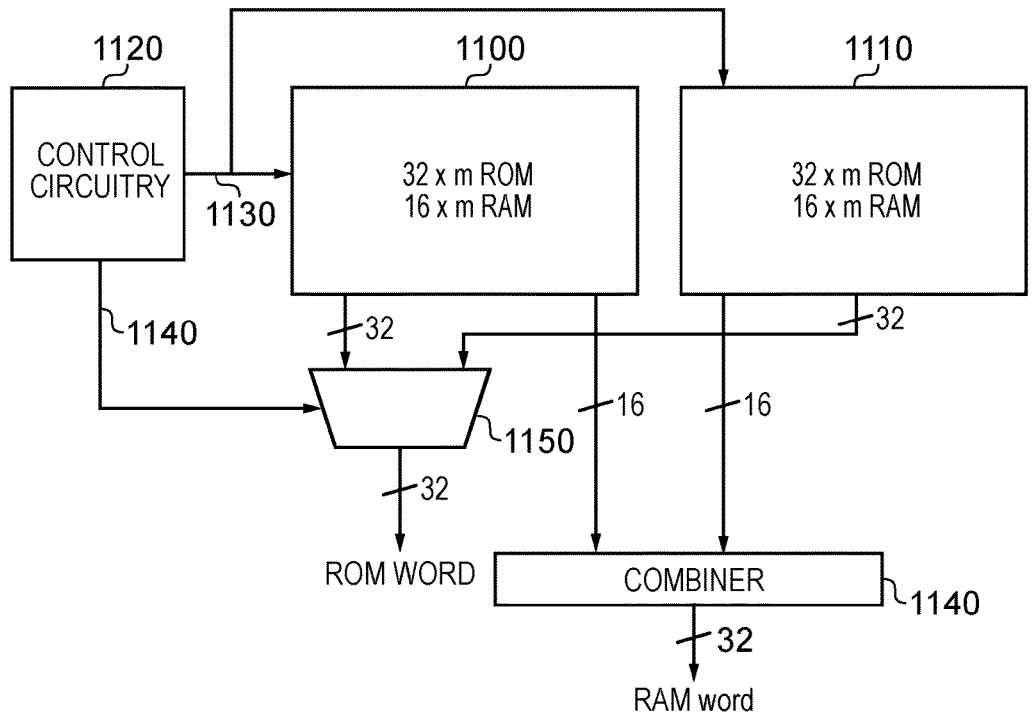
FIG. 11 schematically illustrates an example of a memory structure.
Figure 12:
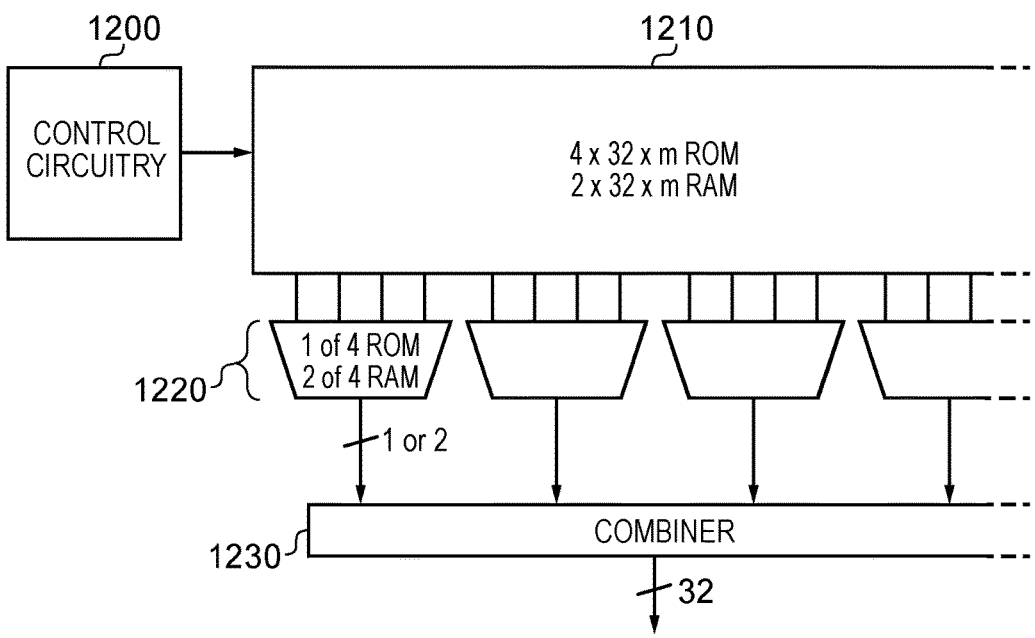
FIG. 12 schematically illustrates another example of a memory structure.

In the examples discussed above, each second circuit element is interleaved with multiple adjacent ROM elements on the substrate. For example, in FIG. 5, each RAM element is interleaved with two ROM elements. In other embodiments to be discussed below, the interleaving can be 1:1, but in the case that a particular structure contains a greater density of one element type than another, it can be useful to provide, nevertheless, a consistently-sized output group of data bits (words), for example 32 bit words. FIGS. 11 and 12 provide respective examples of how to achieve this using such a 1: many interleaving. As discussed, the aim of control circuitry provided in FIGS. 11 and 12 is to access the ROM elements in groups of n ROM elements, where n is an integer greater than 1, and to access the second circuit elements (for example, RAM elements) also in groups of n second circuit elements.

FIG. 11 provides one example arrangement having two arrays of ROM elements 1100, 1110. Each array has 32×m ROM elements and (by virtue of the 1:2 ratio) 16×m RAM elements. Control circuitry 1120 includes the functionality of the control circuitry 700 described above and controls the operation of accesses to the arrays 1100, 1110, a multiplexer 1150 and a combiner 1160 via control signals 1130, 1140.

In the case of an access to a 32 bit word in ROM, that word is read out from 32 bits of a word (or row, as drawn) in a single one of the arrays 1100, 1110, under the control of the signal 1130. The multiplexer 1150 selects one of other of the arrays to provide the output ROM word.

In the case of an access to a 32 bit word in RAM, in order to complete the access in a single memory access cycle, 16 bits of the word are accessed in the array 1100 and 16 bits in the array 1110, under the control of the signal 1130. The combiner 1160 generates the 32 bit output word (in the case of a RAM read access). It will be appreciated that write accesses to RAM operate in a corresponding manner.

FIG. 12 schematically illustrates another example of a memory structure to achieve a consistent (n bit) word input or output.

Control circuitry 1200 includes the functionality of the control circuitry 700 discussed above and controls a single array of 4×32×m ROM elements and 2×32×m RAM elements 1210. A set of multiplexers 1220 are arranged to select between data items read from the array 1210. This type of multiplexing is sometimes used in order to reduce any negative effects of data errors, for example those caused by localised occurrences such as particle strikes. Any particular data word is demultiplexed or spread out across the array, for example in every fourth ROM element, so that if a localised event occurs affecting a few adjacent ROM elements, it is more likely that only one bit of the word being accessed will be damaged rather than multiple bits. Detecting and correcting bit errors in single bits is much more straightforward than detecting bit errors in groups of bits.

Because of the different densities of elements of the ROM and the RAM, the multiplexers 1220 are arranged to apply a one in four multiplexing of ROM elements but a two in four multiplexing of RAM elements. The output of the multiplexers 1220 are combined by a combiner 1230 to generate an output 32 bit word.

Figure 13:
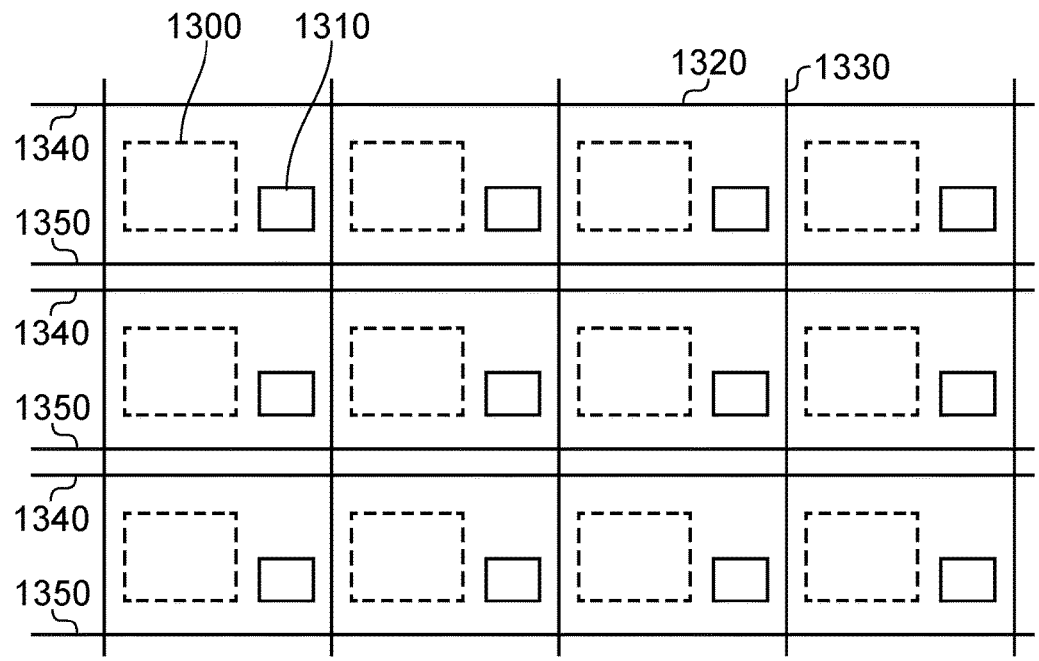
FIGS. 13 and 14 schematically illustrate examples of the sharing of control lines.
Figure 14:
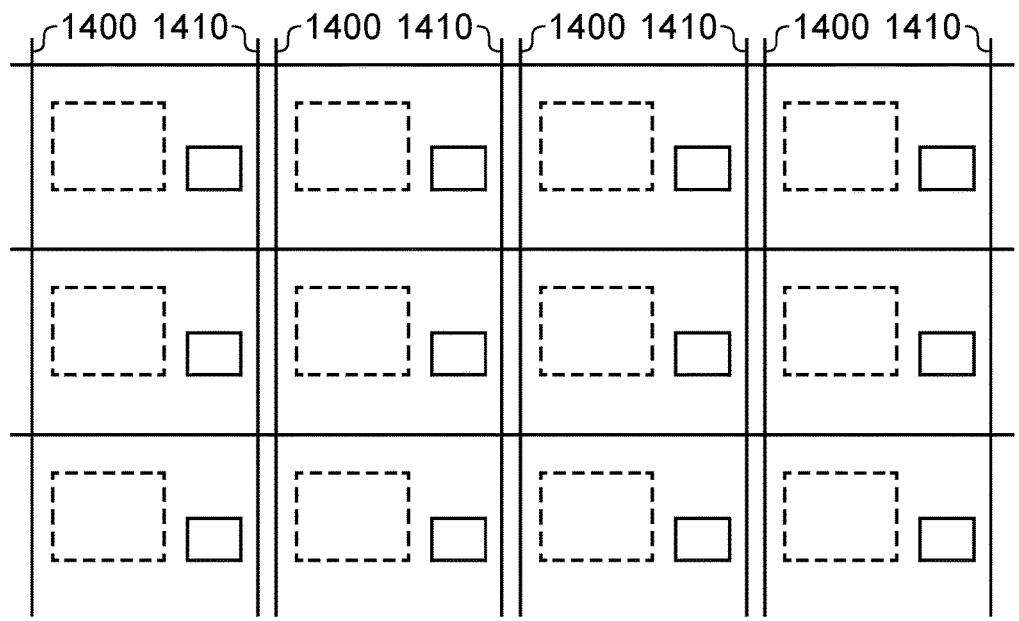

FIGS. 13 and 14 schematically illustrate examples of the sharing of control lines. In these examples, a 1:1 ratio between ROM elements and second circuit elements is used, as an alternative to the 1:2 ratio in FIG. 5. Each ROM element is represented schematically by a broken line box 1300 and each second circuit element is represented schematically by a solid line box 1310. The same notation applies to FIG. 14.

For the sake of the diagrams, word lines are shown as horizontal lines 1320 and bit lines are shown as vertical lines 1330. Again, the same notation applies to FIG. 14.

In FIG. 13, the bit lines are shared between the ROM elements 1300 and the second circuit elements 1310. However, respective word lines are provided for the two types of element such that word lines 1340 apply to ROM elements and word lines 1350 apply to rows of second circuit elements.

In FIG. 14, the word lines are shared between the ROM elements and the second circuit elements, but respective bit lines are provided for the two types of element so that bit lines 1400 relate to (for example) the ROM elements and bit lines 1410 relate to the second circuit elements.

In general terms, either of these arrangements can be useful. In the example of FIG. 5 using memory elements, it can be convenient to share bit lines as shown, but the other arrangement (corresponding to FIG. 14) could be used. In the case of the second circuit elements being other types of element, again either arrangement could be used, but in some examples, particularly where the electrical properties of the individual circuit elements are rather different to those of individual ROM elements, in can be advantageous to use separate respective bit lines but common word lines as shown in FIG. 14. For example, various types of second circuit element may be used such as light emitting elements or light sensing elements. If light emitting elements are used, they may require a driving current somewhat greater than any electrical requirements of the ROM elements 1300, and so keeping the bit lines separate can allow for these different driving parameters.

Other examples of different types of second circuit element are RAM elements as discussed earlier, or ROM elements different to the first-mentioned (print-programmable) memory elements, such as non-print-programmable ROM elements.

Figure 15:
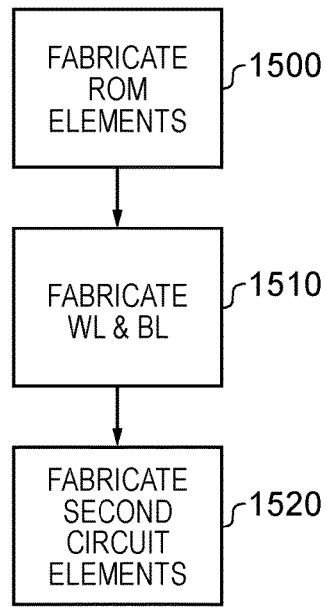
FIG. 15 is a schematic flowchart providing an example of a method of fabricating a circuit.

FIG. 15 is a schematic flowchart providing an example of a method of fabricating a circuit comprising:

fabricating, at a step 1500, an array of programmable memory elements on a substrate, each ROM element having one or more processable regions which, when processed by an external process in which a material is applied to at least partially cover one or more of the regions, are configured to program that memory element to one of multiple states;

fabricating, at a step 1510, a first set of control lines (for example, word lines and bit lines) connected to the array of memory elements, by which the contents of each individual memory element are capable of being accessed by control signals applied to a respective combination of at least two control lines in the first set of control lines (for example, a word line and a bit line); and fabricating, at a step 1520, an array of second circuit elements, different to the memory elements, each connected to a control line of the first set of control lines and to another control line of a second set of control lines, different to the first set of control lines, so as to provide access to second circuit elements in the array.

It is noted that although the fabrication steps 1500, 1510, 1520 are shown in a particular serial order in the flowchart of FIG. 15, they may be carried out in any order and indeed, in some example embodiments, any two (or all three) of the steps may be carried out simultaneously or as part of a single overall fabrication process. An aspect of the fabrication process is that the end result of the process is a circuit having the ROM elements, the lines and the second circuit elements, rather than a particular order by which those individual items are themselves fabricated.

The process of FIG. 15 may represent an example of the step 400 of FIG. 4. An example of the step 410 is to process one or more of the regions by the external non-electrical process by applying a conductive material over one or more of the regions using an ink-jet printing process. The resulting circuit may then be used as shown in the step 420 of FIG. 4.

Another example of a method of fabricating a circuit comprises:

fabricating an array of programmable memory elements fabricated on a substrate, each memory element having one or more processable regions which, when processed by an external process in which a material is applied to at least partially cover one or more of the regions, are configured to program that memory element to one of multiple states; and fabricating an array of second circuit elements, different to the memory elements, interleaved with the memory elements on the substrate.

As discussed above, these two steps could be carried out in either order, or both at the same time, for example as parts of an overall fabrication process.

The substrate may pre-exist as a substrate. That is to say, circuitry could be fabricated (by etching, deposition, printing or the like) onto a blank substrate. Or the substrate could itself be fabricated by deposition or other process (for example, on the surface of a reusable glass support) as part of the fabrication process. The substrate therefore exists at least by the time the device has been fabricated.

Figure 16:
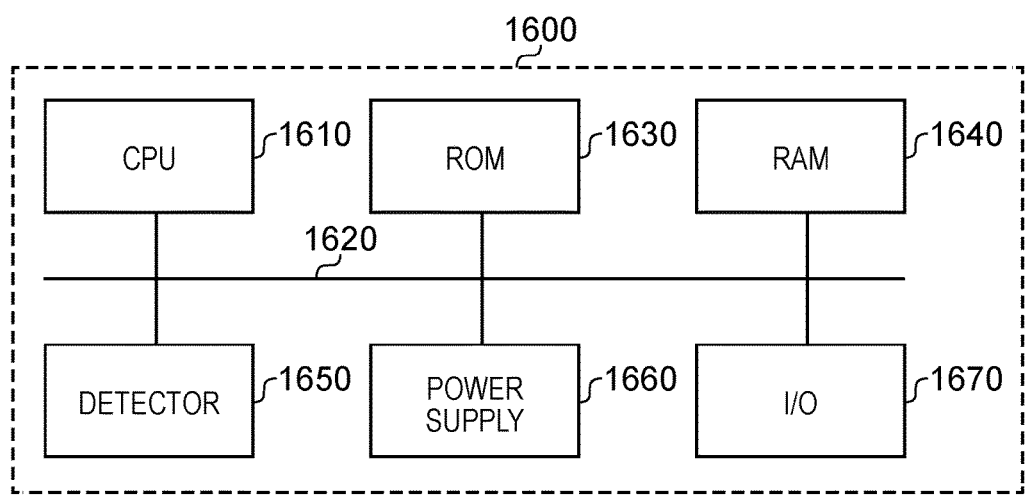
FIG. 16 is a functional schematic diagram of an example circuit.

FIG. 16 is a functional schematic diagram of an example circuit including circuitry such as that described above. The circuit of FIG. 16 can provide a single functional unit for self-contained or networked operation. On a substrate 1600 a central processing unit (CPU 1610) is connected, via a bus arrangement 1620 to a ROM 1630 such as a print-programmable of the type shown in FIG. 5, a RAM 1640, for example being formed at least in part by RAM elements such as those shown in FIG. 5, and optionally a detector 1650 such as a temperature or light detector, a power supply 1660 such as a solar power supply or a printed battery and input/output (I/O) circuitry 1670 such as a network interface.

The arrangement of FIG. 16 provides an example of a data processing apparatus comprising a substrate on which is fabricated a circuit as discussed above (including the array of programmable memory elements) and processing circuitry configured to operate in accordance with information stored by the array of memory elements.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function, in which case software or program instructions by which the function is performed, and a providing medium such as a non-transitory machine-readable medium by which such software or program instructions are provided (for example, stored) are considered to represent embodiments of the disclosure. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

The invention claimed is:

1. A circuit comprising:
    an array of programmable memory elements fabricated on a substrate, each programmable memory element having one or more print-programmable regions which, when processed by an external print programming process in which a material is applied to at least partially cover one or more of the regions, are configured to program that programmable memory element to one of multiple states;
    a first set of control lines connected to the array of programmable memory elements, by which the contents of each individual programmable memory element are configured to be accessed by control signals applied to a respective combination of at least two control lines in the first set of control lines; and
    an array of second circuit elements, different from the programmable memory elements, each connected to a control line of the first set of control lines and to another control line of a second set of control lines, different from the first set of control lines, so as to provide access to second circuit elements in the array;

wherein the second circuit elements are interleaved with the programmable memory elements on the substrate and the second circuit elements on the substrate are fabricated underneath the print-programmable regions so as to be at least partially overlapped by the print-programmable regions of the programmable memory elements.

2. The circuit according to claim 1, in which second circuit elements are disposed between programmable memory elements on the substrate.

3. The circuit according to claim 1, in which the regions comprise a pair of conductors which can be connected to one another by application of a conductive material onto the pair of conductors.

4. The circuit according to claim 3, comprising one or more components connected to each of the pair of conductors to provide an electrostatic discharge path.

5. The circuit according to claim 1, in which the programmable memory elements are read only memory (ROM) elements.

6. The circuit according to claim 1, in which the second circuit elements are random access memory (RAM) elements.

7. The circuit according to claim 1, in which the second circuit elements are:
read only memory elements different from the programmable memory elements,
light emitting elements or
light sensing elements.

8. The circuit according to claim 1, in which:
the first set of control lines comprises a first array of bit lines and a first array of word lines connected to the array of programmable memory elements, by which a word line of the first array of word lines enables access to a group of the programmable memory elements, the contents of individual programmable memory elements in a group of the programmable memory elements to which access has been enabled by said word line of the first array of word lines being configured to be accessed by the bit lines of the first array of bit lines; and
the array of second circuit elements are connected to one but not the other of the first array of word lines and the first array of bit lines so as to provide access to second circuit elements in the array.

9. The circuit according to claim 8, in which the second set of control lines comprises a second array of word lines, by which a word line of the second array of word lines enables access to a group of the second circuit elements, individual second circuit elements in a group of the second circuit elements to which access has been enabled by said word line of the second array of word lines being configured to be accessed by the bit lines of the first array of bit lines.

10. The circuit according to claim 8, in which:
the programmable memory elements are each connected to a single respective bit line, the circuit comprising memory reading circuitry configured to detect the state of a programmable memory element using the single respective bit line.

11. The circuit according to claim 9, in which each second circuit element is interleaved with multiple adjacent programmable memory elements on the substrate.

12. The circuit according to claim 11, in which:
the second circuit elements are each connected to a pair of bit lines, the circuit comprising second circuit element access circuitry configured to access the state of a second circuit element according to a differential signal on the respective pair of bit lines.

13. The circuit according to claim 12, comprising:
control circuitry to access the programmable memory elements in groups of n programmable memory elements, where n is an integer greater than 1;
the control circuitry being configured to access the second circuit elements in groups of n second circuit elements, the circuit comprising two arrays of programmable memory elements in which in each array a group of n programmable memory elements is accessed by a respective control line of the first set of control lines, the control circuitry being configured to access second circuit elements in each of the two arrays in order to access a group of n second circuit elements.

14. A circuit comprising:
an array of first means for storing fabricated on a substrate, each first means for storing having one or more print-programmable regions which, when processed by an external process in which a material is applied to at least partially cover one or more of the print-programmable regions, are configured to program that first means for storing to one of multiple states;
a first set of control lines connected to the array of first means for storing, by which the contents of each individual first means for storing are configured to be accessed by control signals applied to a respective combination of at least two control lines in the first set of control lines; and
an array of second means for storing, different from the first means for storing, each second means for storing connected to a control line of the first set of control lines and to another control line of a second set of control lines, different from the first set of control lines, so as to provide access to the second means for storing,
wherein the second means for storing are interleaved with the first means for storing on the substrate and the second means for storing on the substrate are fabricated underneath the print-programmable regions so as to be at least partially overlapped by the print-programmable regions of the first means for storing.

15. A data processing apparatus comprising a substrate on which is fabricated a circuit according to claim 1 and processing circuitry configured to operate in accordance with information stored by the array of programmable memory elements.

16. A method of fabricating a circuit comprising:
fabricating an array of programmable-memory elements on a substrate, each programmable memory element having one or more print-programmable regions which, when processed by an external process in which a material is applied to at least partially cover one or more of the print-programming regions, are configured to program that programmable memory element to one of multiple states;
fabricating a first set of control lines connected to the array of programmable memory elements, by which the contents of each individual programmable memory element are configured to be accessed by control signals applied to a respective combination of at least two control lines in the first set of control lines; and
fabricating an array of second circuit elements, different from the programmable memory elements, each connected to a control line of the first set of control lines and to another control line of a second set of control lines, different from the first set of control lines, so as to provide access to second circuit elements in the array;

wherein the step of fabricating the array of second circuit elements comprises interleaving the array of second circuit elements with the programmable memory elements on the substrate and the second circuit elements on the substrate are fabricated underneath the print-programmable regions so as to be at least partially overlapped by the print-programmable regions of the programmable memory elements.

17. The method according to claim 16, comprising:

processing one or more of the regions by the external non-electrical process by applying a conductive material over one or more of the regions using an ink-jet printing process.

\* \* \* \* \*